United States Patent
Sirard et al.

(10) Patent No.: US 10,068,781 B2
(45) Date of Patent: Sep. 4, 2018

(54) SYSTEMS AND METHODS FOR DRYING HIGH ASPECT RATIO STRUCTURES WITHOUT COLLAPSE USING SACRIFICIAL BRACING MATERIAL THAT IS REMOVED USING HYDROGEN-RICH PLASMA

(71) Applicant: Lam Research Corporation, Fremont, CA (US)

(72) Inventors: Stephen M. Sirard, Austin, TX (US); Ilia Kalinovski, Berkeley, CA (US); Jeff Hahn, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 906 days.

(21) Appl. No.: 14/507,080

(22) Filed: Oct. 6, 2014

(65) Prior Publication Data
US 2016/0097590 A1 Apr. 7, 2016

(51) Int. Cl.
*H01L 21/00* (2006.01)
*H01L 21/67* (2006.01)

(52) U.S. Cl.
CPC .. *H01L 21/67034* (2013.01); *H01L 21/67028* (2013.01)

(58) Field of Classification Search
CPC .................... H01L 21/67034; H01L 21/67028
USPC ....... 34/255, 259, 265; 438/9, 474, 475, 513
See application file for complete search history.

(56) References Cited

U.S. PATENT DOCUMENTS

| | | | |
|---|---|---|---|
| 4,892,635 A * | 1/1990 | Kornblit | H01L 21/31138 204/192.35 |
| 5,571,447 A | 11/1996 | Ward et al. | |
| 6,072,006 A | 6/2000 | Bantu et al. | |
| 6,337,277 B1 | 1/2002 | Chou et al. | |
| 7,687,406 B2 | 3/2010 | Daley et al. | |
| 8,058,178 B1 * | 11/2011 | Goto | G03F 7/427 257/E21.218 |
| 8,187,951 B1 | 5/2012 | Wang et al. | |
| 8,898,928 B2 | 12/2014 | Sirard et al. | |
| 2002/0132184 A1 | 9/2002 | Babcock | |
| 2002/0168785 A1 | 11/2002 | Paz de Araujo et al. | |
| 2003/0017420 A1 * | 1/2003 | Mahorowala | G03F 7/40 430/313 |
| 2003/0045098 A1 * | 3/2003 | Verhaverbeke | H01L 21/67069 438/689 |

(Continued)

OTHER PUBLICATIONS

U.S. Appl. No. 14/489,615, Limary et al.
(Continued)

*Primary Examiner* — John McCormack

(57) ABSTRACT

Systems and methods for drying a substrate including a plurality of high aspect ratio (HAR) structures are performed after at least one of wet etching and/or wet cleaning the substrate using at least one of wet etching solution and/or wet cleaning solution, respectively, and without drying the substrate. Fluid between the plurality of HAR structures is displaced using a solvent including a bracing material. After the solvent evaporates, the bracing material precipitates out of solution and at least partially fills the plurality of HAR structures. The substrate is exposed to plasma generated using a plasma gas chemistry that is hydrogen rich to remove the bracing material thereby drying the substrate including the HAR structures without damaging the plurality of HAR structures.

30 Claims, 6 Drawing Sheets

(56) References Cited

U.S. PATENT DOCUMENTS

| | | | |
|---|---|---|---|
| 2005/0106493 A1 | 5/2005 | Ho et al. | |
| 2010/0055807 A1* | 3/2010 | Srivastava | G03F 7/427 438/9 |
| 2011/0189858 A1 | 8/2011 | Yasseri et al. | |
| 2013/0008868 A1* | 1/2013 | Uozumi | G03F 7/162 216/41 |
| 2013/0143406 A1 | 6/2013 | Hsu et al. | |
| 2014/0373384 A1 | 12/2014 | Sirard et al. | |
| 2016/0042945 A1 | 2/2016 | Limary et al. | |

OTHER PUBLICATIONS

U.S. Appl. No. 13/924,314, Sirard et al., filed Jun. 21, 2013.

U.S. Appl. No. 14/730,457, Sirard, et al.

DiLauro, Anthony M., and Phillips, Scott T.; "Continuous Head-to-Tail Depolymerization: An Emerging Concept for Imparting Amplified Responses to Stimuli-Responsive Materials;" MacroLetter; American Chemical Society Publications; pp. 298-304; Published Mar. 12, 2014.

DiLauro, Anthony M., Zhang, Hua, Baker, Matthew S., Sen, Flory Wong Ayusman, and Phillips, Scott T.; Accessibility of Responsive End-Caps in Films Composed of Stimuli-Responsive, Depolymerizable Poly(phthalaldehydes); Macromolecules; American Chemical Society Publications; pp. 7257-7265; Published Sep. 12, 2013.

Kokubo, Ken, Shirakawa, Shogo, Kobayashi, Naoki, Aoshima, Hisae and Oshima, Takumi; "Facile and Scalable Synthesis of a Highly Hydoxylated Water-Soluble Fullerenol as a Single Nanoparticle;" Nano Research; pp. 204-215; Nov. 1, 2010.

Robbins, Jessica S., Schmid, Kyle M. and Phillips. Scott T.; "Effects of Electronics, Aromaticity, and Solvent Polarity on the Rate of Azaquinone-Methide-Mediated Depolymerization of Aromatic Carbamate Oligomers;" The Journal of Organic Chemistry; pp. 3159-3169; Published Feb. 18, 2013.

Seo, Wanji and Phillips, Scott T.; "Patterned Plastics that Change Physical Structure in Response to Applied Chemical Signals;" JACS Communications; pp. 9234-9235; Published Online Jun. 21, 2010.

Viger, Mathieu L., Grossman, Madeline, Fomina, Nadezda, and Almutairi, Adah; "Low Power Upconverted Near-IR Light for Efficient Polymeric Nanoparticle Degradation and Cargo Release;" Advanced Materials; pp. 3733-3738; 2013.

Kropka, Jamie M., Sakai, Victoria Sakai and Green, Peter F. "Local Polymer Dynamics in Polymer-$C_{60}$ Mixtures"; Nano Letters; 2008; vol. 8, No. 4, pp. 1061-1065; Revised Jan. 21, 2008.

* cited by examiner

SYSTEMS AND METHODS FOR DRYING HIGH ASPECT RATIO STRUCTURES WITHOUT COLLAPSE USING SACRIFICIAL BRACING MATERIAL THAT IS REMOVED USING HYDROGEN-RICH PLASMA

FIELD

The present disclosure relates to systems and methods for processing substrates, and more particularly to systems and methods for drying high aspect ratio (HAR) structures of a substrate without collapse.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Fabrication of substrates such as semiconductor wafers typically requires multiple processing steps that may include material deposition, planarization, feature patterning, feature etching, and/or feature cleaning. These processing steps are typically repeated one or more times during processing of the substrate.

As semiconductor devices continue to scale down to smaller feature sizes, high aspect ratio (HAR) structures are increasingly required to achieve desired device performance objectives. The use of the HAR structures creates challenges for some of the substrate processing steps. For example, wet processes such as etching and cleaning pose problems for the HAR structures due to capillary forces that are generated during drying of the substrate. The strength of the capillary forces depends upon surface tension, a contact angle of the etching, cleaning, or rinsing fluids that are being dried, feature spacing and/or an aspect ratio of the structures. If the capillary forces generated during drying are too high, the HAR structures will become strained or collapse onto each other and stiction may occur, which severely degrades device yield.

To solve this problem, one approach uses rinsing liquids that have a lower surface tension than deionized water to prevent the structures from collapsing. While generally successful for relatively low aspect ratio structures, this approach has the same collapse and stiction issues on higher aspect ratio structures as methods that use deionized water. The rinsing fluids still possess a finite amount of surface tension that generates forces during drying that are still too strong for the fragile HAR structures.

An alternative approach for drying HAR structures involves dissolving and flushing the rinsing fluid with a supercritical fluid. Supercritical fluids are free of surface tension when processed correctly. However, several technical and manufacturing challenges arise when using the supercritical fluids. The challenges include high equipment and safety costs, long process times, variable solvent quality during the process, extreme sensitivity due to the diffuse and tunable nature of the fluid, and wafer defectivity/contamination issues arising from the interaction of the supercritical fluid with components of the processing chamber.

Another strategy for preventing collapse of high aspect ratio structures is to add a permanent mechanical bracing structure that supports the structures. There are several tradeoffs with this approach including higher cost and process complexity that negatively impact throughput and yield. Furthermore, the permanent mechanical bracing structures are limited to certain types of HAR structures.

Freeze drying has also been proposed as an alternative approach for drying HAR structures. Freeze drying eliminates collapse by initially freezing the solvent and then directly sublimating under vacuum. Freeze drying avoids the liquid/vapor interface, which minimizes capillary forces. While showing promise, freeze drying has relatively high cost, low throughput and high defects as compared to competing approaches.

Surface modification of sidewalls of the HAR structures may be performed. In this approach, small molecules may be chemically bonded to the sidewalls of the HAR structures. The small molecules improve collapse performance by either preventing the stiction of materials when they make contact or by altering a contact angle of the wet chemistry to minimize Laplace pressure. Surface modification does not fully eliminate the drying forces and the structures may deform during the drying process, which may cause damage. Furthermore, when surface materials are changed, new tailored molecules are required to bond to the sidewalls of the HAR structures.

SUMMARY

A method for drying a substrate including a plurality of high aspect ratio (HAR) structures includes, after at least one of wet etching and/or wet cleaning the substrate using at least one of wet etching solution and/or wet cleaning solution, respectively, and without drying the substrate: displacing fluid between the plurality of HAR structures using a solvent including a bracing material, wherein after the solvent evaporates, the bracing material precipitates out of solution and at least partially fills the plurality of HAR structures; exposing the substrate to plasma generated using a plasma gas chemistry that is hydrogen rich to remove the bracing material thereby drying the substrate including the HAR structures without damaging the plurality of HAR structures.

In other features, the hydrogen rich chemistry includes greater than 50% molecular and/or atomic hydrogen by molar value. The hydrogen rich chemistry includes one or more reactant gases wherein hydrogen comprises greater than 50% by molar value of the one or more reactant gases. The hydrogen rich chemistry includes a gas mixture of one or more inert gases and one or more reactant gases and wherein hydrogen comprises greater than 50% by molar value of the one or more reactant gases. The hydrogen rich chemistry includes a plurality of gases aA+bB+cC . . . where a, b, c, . . . are molar values and A, B, C, . . . are gases and wherein at least one of the plurality of gases contributing hydrogen has a highest one of the molar values a, b, c . . . .

In other features, the fluid between the plurality of HAR structures that is displaced comprises the at least one of the wet etching solution and/or the wet cleaning solution. The method includes replacing the at least one of the wet etching solution and/or the wet cleaning solution with a transition solvent, and wherein the fluid that is displaced includes the transition solvent. The plasma gas chemistry further comprises at least one of a mild oxidant or an inert gas. The mild oxidant is selected from a group including carbon dioxide, carbon monoxide, nitrous oxide, nitric oxide, nitrogen dioxide, sulfur oxide, sulfur dioxide, water, and oxygen containing hydrocarbons. The mild oxidant includes carbon dioxide. The inert gas is selected from a group including nitrogen, argon, xenon, krypton, helium, and neon.

In other features, the plasma is downstream plasma. Plasma process conditions include plasma generated using plasma power between 500 W-10 kW, vacuum pressure in a processing chamber of 0.1 Torr-3 Torr, a temperature of the substrate support between 25° C.-400° C., and 500-10000 sccms total gas flow of the plasma gas chemistry. The method includes applying a substrate bias during the plasma.

In other features, the plurality of HAR structures have an aspect ratio that is greater than or equal to 15 and the plasma gas chemistry includes a mixture of 90% to 98% molecular hydrogen gas and 10% to 2% carbon dioxide gas. The plurality of HAR structures has an aspect ratio that is greater than or equal to 8. The at least one of the wet etching and/or wet cleaning, the displacing of the fluid between the plurality of HAR structures and the exposing of the plurality of HAR structures occur in a single processing chamber. The at least one of the wet etching and/or wet cleaning and the displacing of the fluid between the plurality of HAR structures occur in a spin coating processing chamber and the exposing of the plurality of HAR structures using plasma occurs in a plasma processing chamber.

A system for drying a substrate including a plurality of high aspect ratio (HAR) structures includes a processing chamber, a substrate support arranged in the processing chamber and a gas delivery system to deliver a gas mixture to the processing chamber. A fluid delivery system is configured to deliver fluid to the substrate. A plasma generator is configured to generate plasma in the processing chamber. A controller is in communication with the fluid delivery system, the gas delivery system and the plasma generator and is configured to, after one of wet etching or wet cleaning the substrate using at least one of wet etching solution and/or wet cleaning solution, respectively, and without drying the substrate: displace fluid between the plurality of HAR structures using a solvent including a bracing material, wherein as the solvent evaporates, the bracing material precipitates out of solution and at least partially fills the plurality of HAR structures; and expose the plurality of HAR structures to plasma generated by the plasma generator using a plasma gas chemistry that is hydrogen rich to remove the bracing material and to dry the substrate including the HAR structures without damaging the plurality of HAR structures.

In other features, the hydrogen rich chemistry includes greater than 50% molecular and/or atomic hydrogen by molar value. The hydrogen rich chemistry includes one or more reactant gases wherein hydrogen comprises greater than 50% by molar value of the one or more reactant gases. The hydrogen rich chemistry includes a gas mixture of one or more inert gases and one or more reactant gases and wherein hydrogen comprises greater than 50% by molar value of the one or more reactant gases. The hydrogen rich chemistry includes a plurality of gases aA+bB+cC where a, b, c, . . . are molar values and A, B, C, . . . are gases and wherein at least one of the plurality of gases contributing hydrogen has a highest one of the molar values a, b, c . . . .

In other features, the fluid between the plurality of HAR structures that is displaced comprises the at least one of the wet etching solution and/or the wet cleaning solution. The controller is configured to replace the at least one of the wet etching solution and/or the wet cleaning solution with a transition fluid. The fluid that is displaced includes the transition fluid. The plasma gas chemistry further comprises at least one of a mild oxidant or an inert gas. The mild oxidant is selected from a group including carbon dioxide, carbon monoxide, nitrous oxide, nitric oxide, nitrogen dioxide, sulfur oxide, sulfur dioxide, water, and oxygen containing hydrocarbons. The mild oxidant includes carbon dioxide. The inert gas is selected from a group including nitrogen, argon, xenon, krypton, helium, and neon. The plasma is downstream plasma.

In other features, plasma process conditions include plasma generated using a plasma power between 500 W-10 kW, vacuum pressure in the processing chamber of 0.1 Torr-3 Torr, a temperature of the pedestal support between 25° C.-400° C., and 500-10000 sccms total gas flow of the plasma gas chemistry. An RF source supplies a substrate bias during the plasma.

In other features, the plurality of HAR structures has an aspect ratio that is greater than or equal to 15 and the plasma gas chemistry includes a mixture of 90% to 98% molecular hydrogen gas and 10% to 2% carbon dioxide gas. The plurality of HAR structures has an aspect ratio that is greater than or equal to 8.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
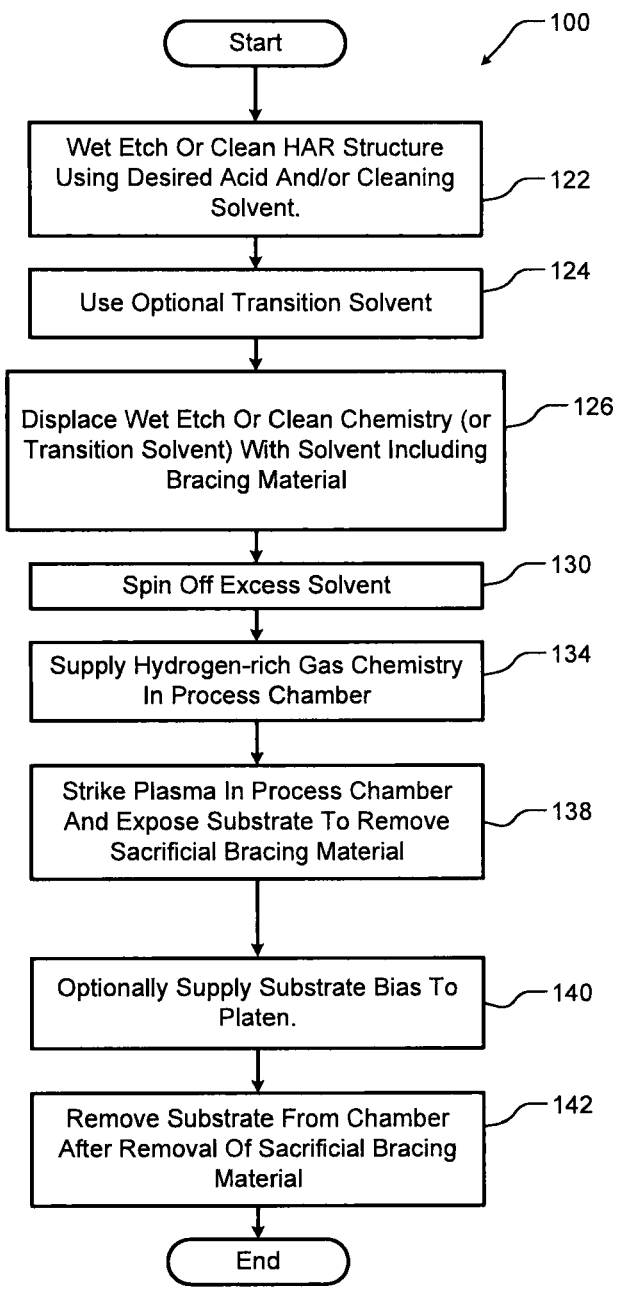
FIG. 1 is a flowchart illustrating an example of a method for drying a plurality of HAR features of a substrate using plasma according to the present disclosure.

Some sacrificial bracing methods have been used to prevent collapse of high aspect ratio (HAR) structures. For example only, commonly-assigned U.S. patent application Ser. No. 13/924,314, filed on Jun. 21, 2013, and entitled "Method of Collapse-Free Drying of High Aspect Ratio Structures", which is hereby incorporated by reference in its entirety, discloses a sacrificial bracing method. As described therein, a sacrificial bracing material, such as a glassy polymer or fullerene solution, is deposited into the HAR structures directly after the wet etching or cleaning process, but prior to drying the wafers. As the solvent evaporates, the sacrificial bracing material precipitates out of solution and fills the structures. A mechanical brace is formed in the HAR structures to counter the capillary forces that are generated during solvent drying. Afterwards, the sacrificial bracing material is removed with a dry plasma process.

The downstream plasma processes typically use reactants such as $N_2/O_2$ or $N_2$-rich/$H_2$ gases. The sacrificial bracing method has been successfully demonstrated on HAR shallow trench isolation (STI) structures with ARs as high as ~20:1. However, removal of the sacrificial bracing structure using plasma processes may cause surface modification. More particularly, $O_2$-rich or $N_2$-rich plasmas may chemically modify the surface of the HAR structures. The surface modification can lead to charging and/or generate stresses that lead to structure collapse and/or stiction.

Removing sacrificial braces from HAR structures such as capacitors after wet etching without causing collapse is difficult. The same bracing materials and plasma chemistries that prevent collapse of shallow trench isolation (STI) HAR structures fails to prevent collapse of capacitor structures with aspect ratios (AR)≥15:1. Un-collapsed capacitors can be collapsed by exposure to downstream ashing chemistries that are $O_2$-rich. While $N_2$-rich/$H_2$ plasma chemistries generally performed better, some finite collapse still occurred. The $O_2$-rich or $N_2$-rich plasmas have been shown to chemically modify the surface of the HAR structures. The surface modification can either lead to charging and/or generate stresses that lead to structure collapse/stiction.

According to the present disclosure, plasma with hydrogen rich chemistry is used to remove the sacrificial bracing material from the HAR features (such as the capacitors with AR≥15:1) without causing collapse. As used herein, HAR refers to the HAR structures having an AR≥8:1, 10:1, 15:1, 20:1 or 50:1.

Examples of hydrogen rich chemistry are set forth below. For example only, the plasma gas chemistry may include greater than 50% molecular and/or atomic hydrogen by molar value. For example only, the hydrogen rich chemistry may also include one or more reactant gases wherein hydrogen comprises greater than 50% by molar value of the one or more reactant gases. For example only, a mixture of one or more inert gases and one or more reactant gases may be used. In some examples, hydrogen comprises greater than 50% by molar value of the one or more reactant gases but not necessarily of the entire gas mixture including the one or more inert gases and the one or more reactant gases. In some examples, a gas mixture of 90% argon (an inert gas) and 10% $H_2$ may be used.

In other examples, the plasma gas chemistry is hydrogen rich and may include a plurality of gases (e.g. aA+bB+cC . . . where a, b, c, . . . are molar values and A, B, C, . . . are gases) where at least one of the plurality of gases contributing hydrogen has a highest one of the molar values a, b, c . . . . For example, the hydrogen rich gas mixture may include 40% $H_2$, 30% $N_2$, and 30% $CO_2$ or 40% $H_2$, 30% $N_2$, and 30% CO, although other gas mixtures may be used.

For example only, the plasma gas chemistry may be mixed with a mild oxidant such as $CO_2$. In one example, the plasma gas chemistry includes a gas mixture of 90% to 98% $H_2$ and 10% to 2% $CO_2$, respectively. In one example, the plasma gas chemistry includes a mixture of 96% $H_2$ and 4% $CO_2$. Still other examples are set forth below.

Sacrificial bracing using hydrogen rich chemistry enables wet processing of the HAR structures without collapse. For example, the sacrificial bracing removal process enables the use of sacrificial bracing for HAR capacitor structures having AR≥15. As a result, the sacrificial bracing method is no longer limited to certain structure types and can be fully implemented with existing fabrication equipment.

Referring now to FIG. 1, a method 100 for drying a substrate including a plurality of HAR structures is shown. The substrate including the plurality of HAR structures is wet etched or cleaned at 122 using a desired etchant solution such as acid and/or a cleaning solution. After the wet etching or cleaning, the substrate is not dried and the wet etching or cleaning solution remains on the substrate.

In some examples, the HAR structures are lines/spaces, STI, or cylindrical capacitors. The materials may include metal, semiconductor or dielectric materials. In some examples, the etching and cleaning processes will be performed in a spin coating processing chamber.

At 124, an optional transition solvent may be used to displace the wet etching or cleaning solution. The transition solvent may be used depending on the chemical make-up and compatibility of the etching and/or cleaning solutions and the solvent used to dissolve the bracing material.

At 126, the wet etching or cleaning solutions or the optional transitional solvent is displaced by a solvent including a sacrificial bracing material. In some examples, the sacrificial bracing material may include polymers, fullerenes, carbon-containing materials, or other organic material. As can be appreciated, the substrate remains wet during steps 122, 124 and 126. In some examples, the sacrificial bracing material includes a carbon-containing material that can be volatilized with hydrogen rich chemistry.

At 130, excess solvent may optionally be spun off. The sacrificial mechanical brace fills the plurality of HAR structures on the substrate. As the solvent evaporates, the sacrificial bracing material precipitates out of solution and fills the structures. A mechanical brace is formed in the HAR structures to counter the capillary forces that are generated during solvent drying. The substrate may be transferred to a plasma processing chamber or processing may continue without transfer if a combined spin coating and plasma processing chamber is used.

In some examples, the substrate support or platen heats the substrate to a temperature between 25° C.-400° C. during exposure to the plasma. At 134, the substrate is exposed to hydrogen rich plasma gas chemistry. Additional gases may be mixed with the hydrogen rich gas to improve residue or etch rate and without modifying the surface of the HAR structures. In some examples, the additional gases may include mild oxidants or inert gases. Examples of mild oxidants include carbon dioxide, carbon monoxide, nitrous oxide, nitric oxide, nitrogen dioxide, sulfur oxide, sulfur dioxide, water, and oxygen containing hydrocarbons. In some examples, the mixture includes less than 10% $CO_2$. Inert gases may also be added, including nitrogen, argon, xenon, krypton, helium, and neon. In some examples, the $H_2$-rich molecules, such as methane ($CH_4$) or ammonia ($NH_3$), may be used. These H-rich or $H_2$-rich molecules may be used alone or in combination with inert gases and/or mild oxidants.

At 138, plasma is struck in the processing chamber and the substrate is exposed to the plasma to remove the sacrificial bracing material. In some examples, the plasma is remote or downstream plasma. In some examples, process conditions include plasma generated using an RF power of 500 W-10 kW, vacuum pressure of 0.1 Torr-3 Torr, and 500-10000 sccms total gas flow, although other process conditions may be used. At 140, an optional substrate RF bias may be used.

At 142, the substrate is removed from the plasma processing chamber after removal of sacrificial bracing material.

Figure 2A:
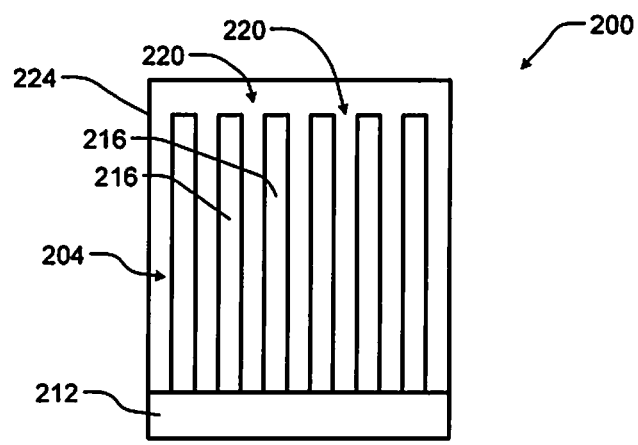
FIGS. 2A-2D are side views illustrating an example of the substrate during drying using plasma according to the present disclosure.

Referring now to FIGS. 2A-2D, an example of a substrate 200 is illustrated during drying using sacrificial bracing. In FIG. 2A, the substrate 200 includes a plurality of HAR structures 204 extending upwardly from a lower substrate layer 212. For example, the plurality of HAR structures 204 may include one or more pillars 216 or other structures such as lines/spaces, capacitors, etc. that extend upwardly from the lower substrate layer 212, although other HAR structures are contemplated.

Figure 2B:
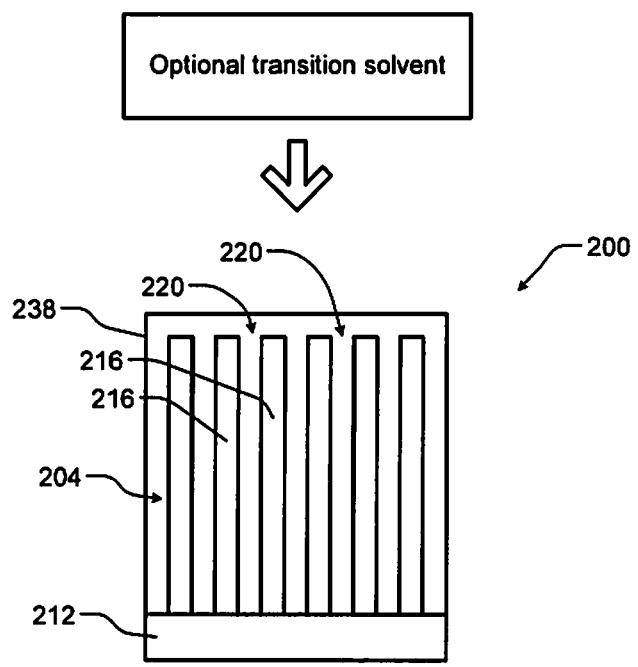
Figure 2D:
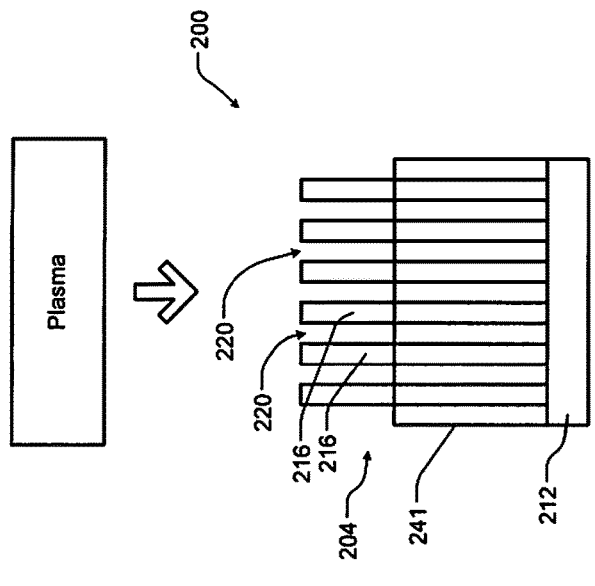
Figure 2C:
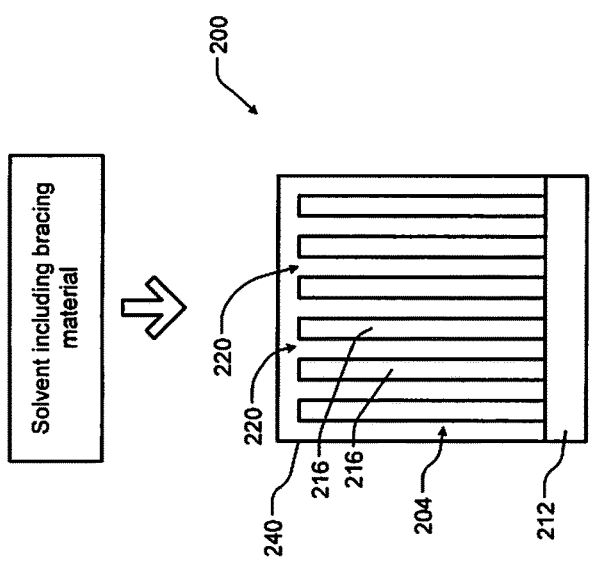

Fluid 224 remains on the substrate 200 after wet etching or wet cleaning. For example only, the fluid 224 may be located between the pillars 216 as identified at 220. In FIG. 2B, an optional transition solvent 238 may be used to displace the fluid 224. In FIG. 2C, a solvent 240 including sacrificial bracing material may be used to displace the fluid 224 or the optional transition solvent 238 (if used). In FIG. 2D, the plasma may be used to remove bracing material at 241 without damaging the plurality of HAR structures.

Figure 3B:
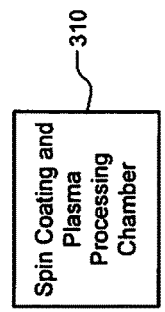
FIG. 3B is a functional block diagram illustrating a combined spin coating and plasma processing chamber according to the present disclosure.
Figure 3A:
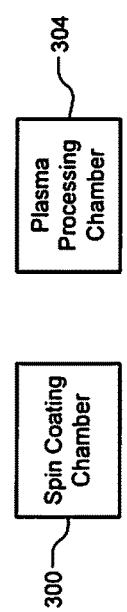
FIG. 3A is a functional block diagram illustrating a spin coating processing chamber and a plasma processing chamber according to the present disclosure.

Referring now to FIGS. 3A and 3B, examples of processing chambers for drying the substrate with the plurality of HAR structures is shown. In FIG. 3A, wet etching and/or cleaning may be performed in a spin coating processing chamber 300. In addition, the solvent with the sacrificial bracing material (or the transitional solvent and the solvent with the sacrificial bracing material) may be applied to the substrate in the spin coating processing chamber 300. Then, the substrate may be transferred to a plasma processing chamber 304 for plasma processing to remove the sacrificial bracing material without damage to the plurality of HAR structures.

In FIG. 3B, a combined spin coating and plasma processing chamber 310 is shown. Wet etching and/or cleaning may be performed using spin coating components of the combined spin coating and plasma processing chamber 310. The solvent with the sacrificial bracing material (or the transitional solvent and the solvent with the sacrificial bracing material) may be applied using the spin coating components. Then, plasma components of the combined spin coating and plasma processing chamber 310 for plasma processing to remove the sacrificial bracing material of the substrate without damage to the HAR structures.

Figure 4:
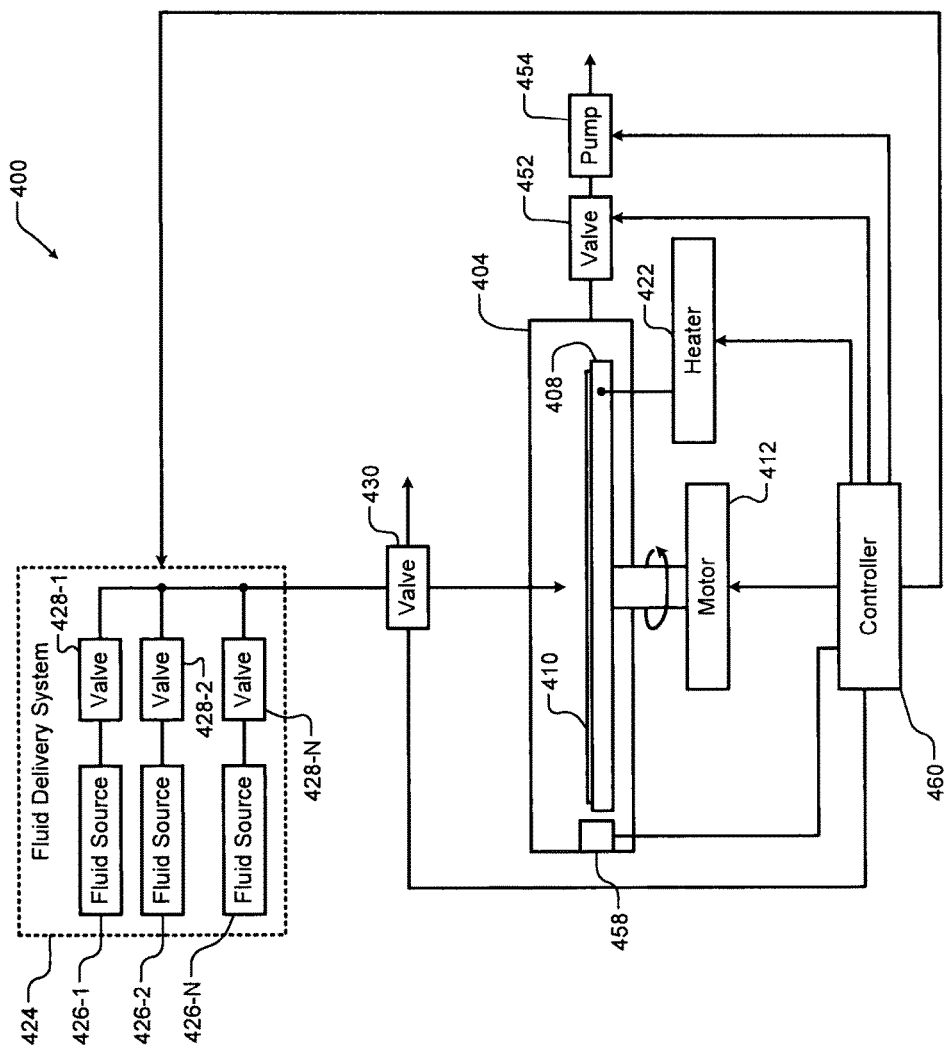
FIG. 4 is a functional block diagram of an example spin coating processing chamber according to the present disclosure.

Referring now to FIG. 4, an example of a system 400 including a spin coating processing chamber 404 is shown. A substrate support 408 such as a pedestal or platen may be provided. A substrate 410 is arranged on the substrate support 408. A motor 412 may be used to selectively rotate the substrate support 408 as needed to spin coat liquids on the substrate 410. The substrate support 408 may include an embedded coil (not shown) that is connected to a heater 422.

A fluid delivery system 424 is used to deliver fluids from one or more fluid sources 426-1, 426-2, . . . , and 426-N (collectively fluid sources 426) to the substrate 410. The fluid delivery system 424 may include one or more valves 428-1, 428-2, . . . , and 428-N (collectively valves 428). A diverting valve 430 may be used to flush fluids from the fluid delivery system 424. The fluid delivery system 424 may be configured to deliver fluids for wet etching, wet cleaning, flushing fluid, solvent including the structural bracing material, and/or other fluids. A valve 452 and a pump 454 may be used to evacuate reactants from the spin coating processing chamber 404 as needed. One or more sensors 458 may be provided to monitor conditions such as temperature and pressure in the process chamber 404.

A controller 460 may be used to control one or more devices in the system 400. More particularly, the controller 460 may be used to control the motor 412, the heater 422, the fluid delivery system 424, and/or the valve 452 and the pump 454. The controller 460 may operate in part based on feedback from the one or more sensors 458.

Figure 5:
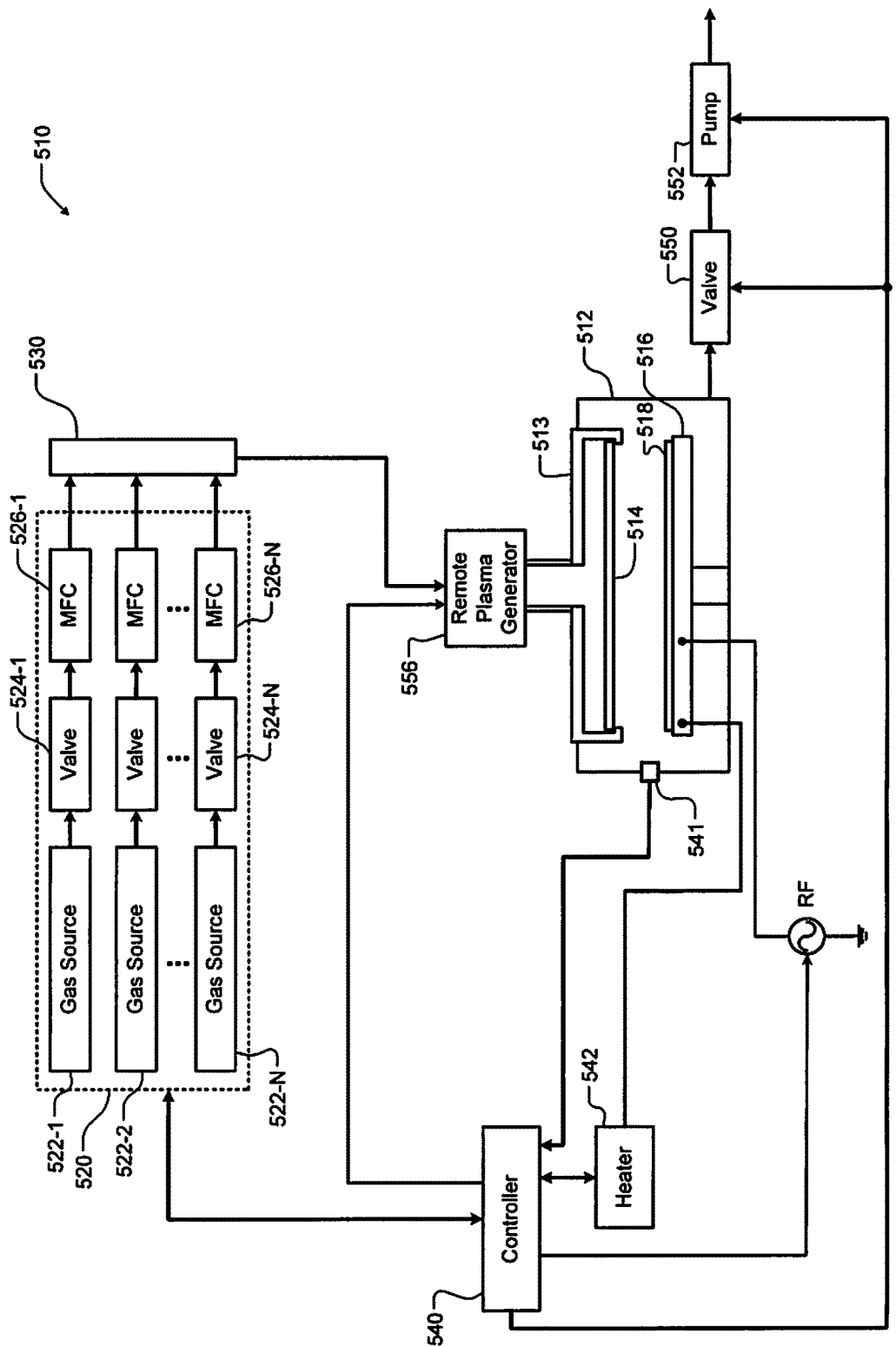
FIG. 5 is a functional block diagram of an example plasma processing chamber according to the present disclosure.

Referring now to FIG. 5, an example of a substrate processing system 510 according to the present disclosure is shown. The substrate processing system 510 includes a process chamber 512 and a gas distribution device 513. In some examples, remote plasma may be supplied to or created in the gas distribution device 513 as will be described further below. A substrate support 516 such as a pedestal or platen may be arranged in the processing chamber 512. During use, a substrate 518 such as a semiconductor wafer or other type of substrate may be arranged on the substrate support 516.

The substrate processing system 510 includes a gas delivery system 520. For example only, the gas delivery system 520 may include one or more gas sources 522-1, 522-2, . . . , and 522-N (collectively gas sources 522) where N is an integer greater than zero, valves 524-1, 524-2, . . . , and 524-N (collectively valves 524), and mass flow controllers (MFC) 526-1, 526-2, . . . , and 526-N (collectively MFC 526). Outputs of the gas delivery system 520 may be mixed in a manifold 530 and delivered to the remote plasma source and/or to the gas distribution device 513. The gas delivery system 520 supplies the plasma gas chemistry.

A controller 540 may be connected to one or more sensors 541 that monitor operating parameters in the process chamber 512 such as temperature, pressure, etc. A heater 542 may be provided to heat the substrate support 516 and the substrate 518 as needed. A valve 550 and pump 552 may be provided to evacuate gas from the process chamber 512.

For example only, a plasma generator 556 may be provided. In some examples, the plasma generator 556 is a downstream plasma source. The plasma generator 556 may include a plasma tube, an inductive coil or another device to create the remote plasma. For example only, the plasma generator 556 may use radio frequency (RF) or microwave power to create remote plasma using the gas chemistry identified above. In some examples, an inductive coil is wound around an upper stem portion of a showerhead and is excited by an RF signal generated by an RF source and a matching network. Reactive gas flowing through the stem portion is excited into a plasma state by the RF signal passing though the inductive coil.

The controller 540 may be used to control the gas delivery system 520, the heater 542, the valve 550, the pump 552, and plasma generated by the remote plasma generator 556.

Figure 6:
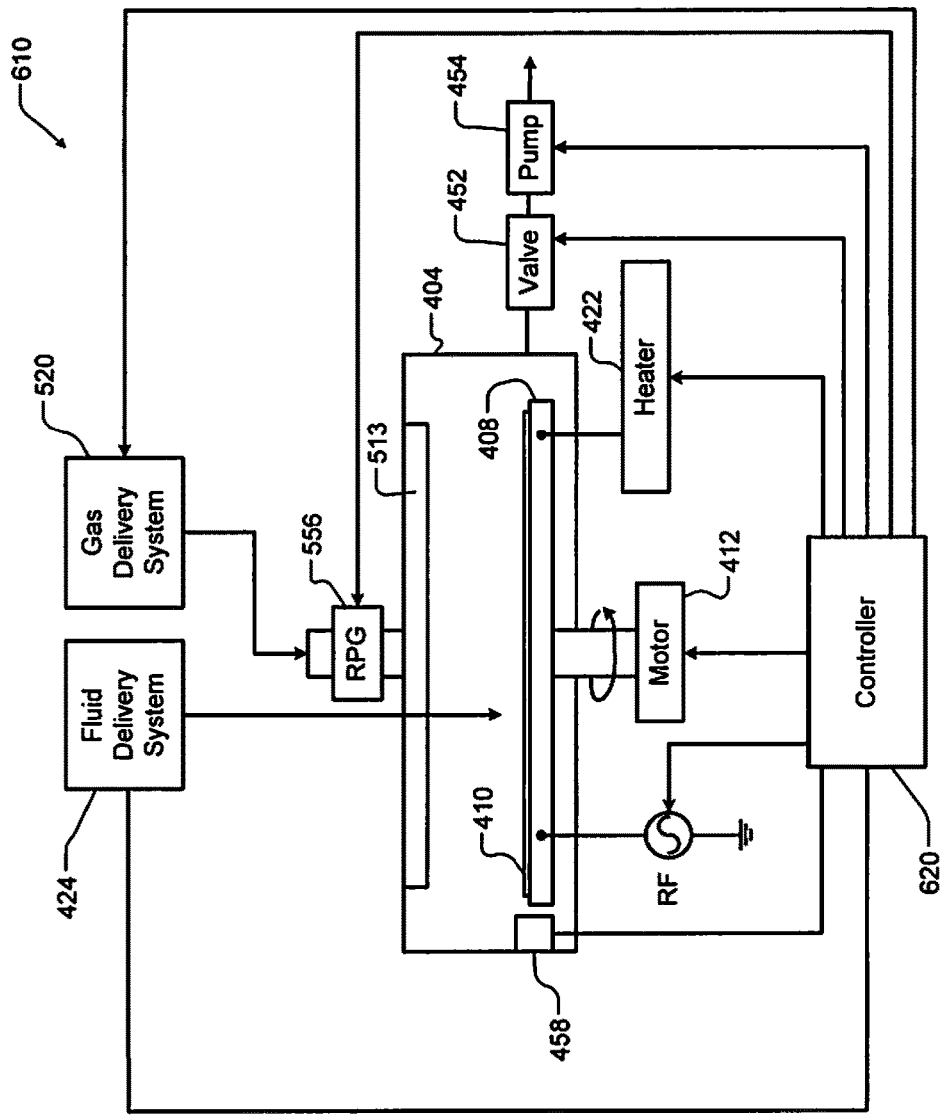
FIG. 6 is a functional block diagram of an example combined spin coating and plasma processing chamber according to the present disclosure.

Referring now to FIG. 6, a combined spin coating and plasma processing chamber 610 is shown. The combined spin coating and plasma processing chamber 610 includes a controller 620 configured to control wet etching or wet cleaning, application of the optional transitional solvent, application of the solvent including the sacrificial bracing material, and generation of the plasma.

More particularly, the controller 620 delivers the wet etching solution or the cleaning solution to the substrate. Afterwards, the controller 620 delivers the solvent including the sacrificial bracing material (or the optional transitional solvent and then the solvent including the sacrificial bracing material). During or after fluid delivery, the controller may rotate the substrate support 408 using the motor 412 to spin-coat the fluid onto the substrate.

After application, the solvent evaporates and the sacrificial bracing material supports plurality of the HAR structures. Subsequently, the controller 620 controls the gas delivery system 520 and the plasma generator 556 to generate the plasma to remove the sacrificial bracing material and to dry the HAR structures without damaging the HAR structures.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a plasma strip chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for drying a substrate including a plurality of high aspect ratio (HAR) structures, comprising:
   after at least one of wet etching and/or wet cleaning the substrate using at least one of wet etching solution and/or wet cleaning solution, respectively, and without drying the substrate:
       displacing fluid between the plurality of HAR structures using a solvent including a bracing material, wherein after the solvent evaporates, the bracing material precipitates out of solution and at least partially fills the plurality of HAR structures; and
       exposing the substrate to plasma generated using a plasma gas chemistry that includes an oxidant and that is hydrogen rich to remove the bracing material, thereby drying the substrate including the plurality of HAR structures without causing collapse of the plurality of HAR structures.

2. The method of claim 1, wherein the plasma gas chemistry includes greater than 50% molecular and/or atomic hydrogen by molar value.

3. The method of claim 1, wherein the plasma gas chemistry includes one or more reactant gases wherein hydrogen comprises greater than 50% by molar value of the one or more reactant gases.

4. The method of claim 1, wherein the plasma gas chemistry includes a plurality of gases aA+bB+cC . . . where a, b, c, . . . are molar values and A, B, C, . . . are gases contributing hydrogen and wherein at least one of the plurality of gases contributing hydrogen has a highest one of the molar values a, b, c . . . .

5. The method of claim 1, wherein the fluid between the plurality of HAR structures that is displaced comprises the at least one of the wet etching solution and/or the wet cleaning solution.

6. The method of claim 1, further comprising replacing the at least one of the wet etching solution and/or the wet cleaning solution with a transition solvent, and wherein the fluid that is displaced includes the transition solvent.

7. The method of claim 1, wherein the oxidant is selected from a group including carbon dioxide, carbon monoxide, nitrous oxide, nitric oxide, nitrogen dioxide, sulfur oxide, sulfur dioxide, water, and oxygen containing hydrocarbons.

8. The method of claim 1, wherein the oxidant includes carbon dioxide.

9. The method of claim 1, wherein the plasma is downstream plasma.

10. The method of claim 1, wherein plasma process conditions include plasma generated using plasma power between 500 W-10 kW, vacuum pressure in a processing chamber of 0.1 Torr-3 Torr, a temperature of a substrate support between 25° C.-400° C., and 500-10000 sccms total gas flow of the plasma gas chemistry.

11. The method of claim 1, further comprising applying a substrate bias during the plasma generation.

12. The method of claim 1, wherein the plurality of HAR structures have an aspect ratio that is greater than or equal to 15 and the plasma gas chemistry includes a mixture of 90% to 98% molecular hydrogen gas and 10% to 2% carbon dioxide gas.

13. The method of claim 1, wherein the plurality of HAR structures has an aspect ratio that is greater than or equal to 8.

14. The method of claim 1, wherein the at least one of the wet etching and/or wet cleaning, the displacing of the fluid between the plurality of HAR structures and the exposing of the plurality of HAR structures occur in a single processing chamber.

15. The method of claim 1, wherein the at least one of the wet etching and/or wet cleaning and the displacing of the fluid between the plurality of HAR structures occur in a spin coating processing chamber and the exposing of the plurality of HAR structures using plasma occurs in a plasma processing chamber.

16. The method of claim 1 wherein exposing the substrate to plasma includes exposing the substrate to plasma generated using the plasma gas chemistry that includes an oxidant and that is hydrogen rich to remove the bracing material thereby drying the substrate including the plurality of HAR structures without damaging the plurality of HAR structures.

17. A system for drying a substrate including a plurality of high aspect ratio (HAR) structures, comprising:

a processing chamber;
a substrate support arranged in the processing chamber;
a gas delivery system to deliver a gas mixture to the processing chamber;
a fluid delivery system configured to deliver fluid to the substrate;
a plasma generator configured to generate plasma in the processing chamber;
a controller in communication with the fluid delivery system, the gas delivery system and the plasma generator and configured to, after one of wet etching or wet cleaning the substrate using at least one of wet etching solution and/or wet cleaning solution, respectively, and without drying the substrate:
  displace fluid between the plurality of HAR structures using a solvent including a bracing material,
  wherein as the solvent evaporates, the bracing material precipitates out of solution and at least partially fills the plurality of HAR structures; and
  expose the plurality of HAR structures to plasma generated by the plasma generator using a plasma gas chemistry that includes an oxidant and that is hydrogen rich to remove the bracing material and to dry the substrate including the HAR structures without causing collapse of the plurality of HAR structures.

18. The system of claim 17, wherein the plasma gas chemistry includes greater than 50% molecular and/or atomic hydrogen by molar value.

19. The system of claim 17, wherein the plasma gas chemistry includes one or more reactant gases wherein hydrogen comprises greater than 50% by molar value of the one or more reactant gases.

20. The system of claim 17, wherein the plasma gas chemistry includes a plurality of gases aA+bB+cC . . . where a, b, c, . . . are molar values and A, B, C, . . . are gases contributing hydrogen and wherein at least one of the plurality of gases contributing hydrogen has a highest one of the molar values a, b, c . . . .

21. The system of claim 17, wherein the fluid between the plurality of HAR structures that is displaced comprises the at least one of the wet etching solution and/or the wet cleaning solution.

22. The system of claim 17, wherein the controller is configured to replace the at least one of the wet etching solution and/or the wet cleaning solution with a transition fluid, and wherein the fluid that is displaced includes the transition fluid.

23. The system of claim 17, wherein the oxidant is selected from a group including carbon dioxide, carbon monoxide, nitrous oxide, nitric oxide, nitrogen dioxide, sulfur oxide, sulfur dioxide, water, and oxygen containing hydrocarbons.

24. The system of claim 17, wherein the oxidant includes carbon dioxide.

25. The system of claim 17, wherein the plasma is downstream plasma.

26. The system of claim 17, wherein plasma process conditions include plasma generated using a plasma power between 500 W-10 kW, vacuum pressure in the processing chamber of 0.1 Torr-3 Torr, a temperature of a substrate support between 25° C.-400° C., and 500-10000 sccms total gas flow of the plasma gas chemistry.

27. The system of claim 17, further comprising an RF source to supply a substrate bias during the plasma generation.

28. The system of claim 17, wherein the plurality of HAR structures has an aspect ratio that is greater than or equal to 15 and the plasma gas chemistry includes a mixture of 90% to 98% molecular hydrogen gas and 10% to 2% carbon dioxide gas.

29. The system of claim 17, wherein the plurality of HAR structures has an aspect ratio that is greater than or equal to 8.

30. The system of claim 17 wherein the controller is configured to expose the plurality of HAR structures to plasma generated by the plasma generator using the plasma gas chemistry that includes an oxidant and that is hydrogen rich to remove the bracing material and to dry the substrate including the plurality of HAR structures without damaging the plurality of HAR structures.

* * * * *